United States Patent
Yoon et al.

(10) Patent No.: US 10,571,492 B2
(45) Date of Patent: Feb. 25, 2020

(54) CURRENT SENSOR

(71) Applicants: HYUNDAI MOTOR COMPANY, Seoul (KR); KIA MOTORS CORPORATION, Seoul (KR)

(72) Inventors: Jae Hoon Yoon, Seoul (KR); Chang Han Jun, Hwaseong-si (KR)

(73) Assignees: Hyundai Motor Company, Seoul (KR); KIA Motors Corporation, Seoul (KR)

(*) Notice: Subject to any disclaimer, the term of this patent is extended or adjusted under 35 U.S.C. 154(b) by 0 days.

(21) Appl. No.: 15/829,001

(22) Filed: Dec. 1, 2017

(65) Prior Publication Data
US 2018/0356446 A1  Dec. 13, 2018

(30) Foreign Application Priority Data
Jun. 7, 2017  (KR) .................. 10-2017-0070586

(51) Int. Cl.
*G01R 15/14* (2006.01)
*G01R 1/20* (2006.01)

(52) U.S. Cl.
CPC .......... *G01R 15/146* (2013.01); *G01R 1/203* (2013.01)

(58) Field of Classification Search
CPC .............................. G01R 15/146; G01R 1/203
See application file for complete search history.

(56) References Cited

U.S. PATENT DOCUMENTS

| | | | | |
|---|---|---|---|---|
| 3,260,939 | A | * 7/1966 | Harvey | G01R 1/203 324/126 |
| 5,355,273 | A | * 10/1994 | Yoshizawa | B60R 16/0239 361/105 |
| 8,031,043 | B2 | 10/2011 | Schultz et al. | |
| 8,471,674 | B2 | 6/2013 | Yoshioka | |
| 2003/0090241 | A1 | * 5/2003 | Nakatsu | H01C 1/14 322/27 |
| 2012/0229247 | A1 | * 9/2012 | Yoshioka | G01R 1/203 338/49 |
| 2018/0120359 | A1 | * 5/2018 | Nakamura | G01R 15/00 |
| 2018/0188295 | A1 | * 7/2018 | Kameko | H01C 13/00 |
| 2018/0191220 | A1 | * 7/2018 | Kato | F04C 29/0085 |
| 2018/0275171 | A1 | * 9/2018 | Murakami | H01C 13/02 |

FOREIGN PATENT DOCUMENTS

JP  5614806 B2  10/2014

* cited by examiner

*Primary Examiner* — Christopher P McAndrew
*Assistant Examiner* — Zannatul Ferdous
(74) *Attorney, Agent, or Firm* — Brinks Gilson & Lione

(57) ABSTRACT

The present disclosure provides a current sensor including: a shunt resistor provided between a first bus bar and a second bus bar, and a fastener coupled through the first bus bar, the second bus bar, and the shunt resistor. The first bus bar has a first through-hole, the second bus bar has a second through-hole, and the shunt resistor has a third through-hole. The first through-hole, the second through-hole, and the third through-hole are aligned with one another to allow the fastener to pass through the first to third through-holes.

11 Claims, 4 Drawing Sheets

CURRENT SENSOR

CROSS-REFERENCE TO RELATED APPLICATION

The present application claims priority to and the benefit of Korean Patent Application No. 10-2017-0070586, filed on Jun. 7, 2017, which is incorporated herein by reference in its entirety.

FIELD

The present disclosure relates to a current sensor that senses electric current flowing from a power source to a load.

BACKGROUND

The statements in this section merely provide background information related to the present disclosure and may not constitute prior art.

Current sensors for detecting electric current include a shunt resistance type current sensor, a current transformer (CT), a Hall effect current sensor, and the like.

Among these current sensors, the shunt resistance type current sensor has been widely used due to its high accuracy and low price. The shunt resistance type current sensor has a shunt resistor, which is a resistor with low resistance, in a circuit to measure electric current and is configured to measure a current value based on a voltage difference between opposite ends of the shunt resistor.

A shunt resistance type current sensor in the related art includes an input bus bar connected to a power source, an output bus bar connected to a load, and a shunt resistor connected between the input bus bar and the output bus bar.

An inverter is connected to the power source, and the input bus bar is connected to a power module of the inverter. The shunt resistor is coupled to the input bus bar and the output bus bar through brazing and sensing wires are welded to respective opposite ends of the shunt resistor. The sensing wires have a connector coupled to a gate board of the inverter. The shunt resistor may be electrically connected to a current sensing circuit of the gate board by connecting the connector to the current sensing circuit of the gate board.

When electric current supplied from the power source through the input bus bar flows through the shunt resistor, a voltage value may be varied depending on the resistance of the shunt resistor, and thus the electric current flowing through the bus bars may be sensed.

However, since the shunt resistance type current sensor in the related art has a structure in which the shunt resistor is connected between the input bus bar and the output bus bar through brazing and the sensing wires are welded to the opposite ends of the shunt resistor, an assembly process of the current sensor may be complex, which results in an increase in manufacturing cost.

Furthermore, the shunt resistance type current sensor in the related art is difficult to be reworked since the shunt resistor and the sensing wires are mounted through brazing and welding.

In addition, in the shunt resistance type current sensor of the related art, separation or movement of the connector may cause deterioration in measurement quality since the current sensor is connected to the gate board of the inverter through the connector.

SUMMARY

An aspect of the present disclosure provides a current sensor that is easy to assemble. Also, it can reduce manufacturing cost, facilitate rework even if a shunt resistor is incorrectly assembled, and improve electrical connection quality.

The technical problems to be solved by the present disclosure are not limited to the aforementioned problems, and any other technical problems not mentioned herein will be clearly understood from the following description by those skilled in the art to which the present disclosure pertains.

In one aspect of the present disclosure, a current sensor may include a shunt resistor provided between a first bus bar and a second bus bar, and a fastener coupled through the first bus bar and the second bus bar and the shunt resistor. The first bus bar has a first through-hole, the second bus bar has a second through-hole, and the shunt resistor has a third through-hole. The first through-hole, the second through-hole, and the third through-hole are aligned with one another to allow the fastener to pass through the first to third through-holes.

The shunt resistor may have a first connection surface configured to electrically connect with the first bus bar and a second connection surface configured to electrically connect with the second bus bar.

An insulating washer, which is formed of an insulating material, may be provided between the fastener and the bus bar adjacent to the fastener.

The fastener may have a head and a threaded part of the fastener configured to extend from the head.

The threaded part of the fastener may have an outer diameter that is smaller than an inner diameter of the first through-hole, an inner diameter of the second through-hole, and an inner diameter of the third through-hole.

The shunt resistor may be electrically connected to a current sensing circuit through a first sensing wire and a second sensing wire.

The first sensing wire may be connected to a first connection surface of the shunt resistor, and the second sensing wire may be connected to a second connection surface of the shunt resistor.

A first shunt resistance washer may be integrally connected to one end of the first sensing wire. The first shunt resistance washer may have a through-hole through which the fastener passes. The first shunt resistance washer may be provided between the first bus bar and the first connection surface of the shunt resistor.

An opposite end of the first sensing wire may be connected to the current sensing circuit through soldering.

A second shunt resistance washer may be integrally connected to one end of the second sensing wire. The second shunt resistance washer may have a through-hole through which the fastener passes. The second shunt resistance washer may be provided between the second bus bar and the second connection surface of the shunt resistor.

An opposite end of the second sensing wire may be connected to the current sensing circuit through soldering.

The first bus bar may be connected to a power source through an inverter, and the second bus bar may be connected to a load.

The first bus bar may be attached to an insulating substrate of a power module of the inverter, and the insulating substrate of the power module of the inverter may have a fastening hole to which the fastener is fastened.

In some forms of the present disclosure, it may be easy to assemble the current sensor, and possible to reduce manufacturing cost, facilitate rework even if the shunt resistor is incorrectly assembled, and improve electrical connection quality.

Further areas of applicability will become apparent from the description provided herein. It should be understood that the description and specific examples are intended for purposes of illustration only and are not intended to limit the scope of the present disclosure.

DRAWINGS

In order that the disclosure may be well understood, there will now be described various forms thereof, given by way of example, reference being made to the accompanying drawings, in which.

Figure 1:
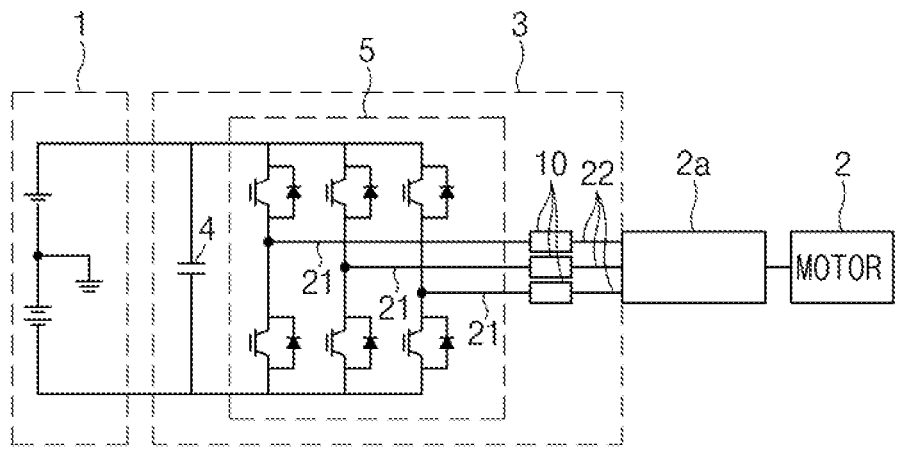
FIG. 1 illustrates an example of an inverter-motor system to which a current sensor is applied.

The drawings described herein are for illustration purposes only and are not intended to limit the scope of the present disclosure in any way.

DETAILED DESCRIPTION

The following description is merely exemplary in nature and is not intended to limit the present disclosure, application, or uses. It should be understood that throughout the drawings, corresponding reference numerals indicate like or corresponding parts and features.

Hereinafter, exemplary forms of the present disclosure will be described in detail with reference to the accompanying drawings. In addition, a detailed description of well-known features or functions will be ruled out in order not to unnecessarily obscure the gist of the present disclosure.

Terms, such as "first", "second", "A", "B", "(a)", "(b)", and the like, may be used herein to describe elements of the present disclosure. Such terms are only used to distinguish one element from another element, and the substance, sequence, order, or number of these elements is not limited by these terms. Unless otherwise defined, all terms used herein, including technical and scientific terms, have the same meaning as those generally understood by those skilled in the art to which the present disclosure pertains. Such terms as those defined in a generally used dictionary are to be interpreted as having meanings equal to the contextual meanings in the relevant field of art, and are not to be interpreted as having ideal or excessively formal meanings unless clearly defined as having such in the present application.

As illustrated in FIG. 1, current sensors 10 in some forms of the present disclosure may be applied to an inverter-motor system.

Referring to FIG. 1, the inverter-motor system may include a power source 1, a load 2 driven by electric current supplied from the power source 1, and an inverter 3 disposed between the power source 1 and the load 2.

The inverter 3 may be configured to convert direct current supplied from the power source 1 to alternating current and to output the converted alternating current to the load 2.

The inverter 3 may have a capacitor 4 for accumulating and storing electric charges, a power module 5 for adjusting the magnitude or frequency of a target current by switching of a switching device (such as an insulated gate bipolar transistor (IGBT)), a gate board (not illustrated) having a gate driver mounted thereon for controlling a gate voltage of the switching device of the power module 5, a control board (not illustrated) for controlling the gate board and the power module 5, and the like.

A plurality of first bus bars 21 may be connected to the power module 5 of the inverter 3. The plurality of first bus bars 21 may be connected to the power source 1 through the inverter 3.

A plurality of second bus bars 22 may be connected to the load 2 through a cable 2a. The plurality of current sensors 10 may be individually connected between the plurality of first bus bars 21 and the plurality of second bus bars 22. Each current sensor 10 may sense electric current flowing from the power source 1 to the load 2.

Direct current of the power source 1 may be converted to alternating current through the inverter 3. The converted alternating current may be input to each current sensor 10 through the corresponding first bus bar 21. The alternating current flowing through the current sensor 10 may be output through the corresponding second bus bar 22. The output alternating current may be input to the load 2.

The first bus bars 21 may be attached to an insulating substrate of the power module 5 of the inverter 3. The first bus bars 21, through which electric current is output from the power module 5, may also be defined as "output bus bars of the power module 5". The second bus bars 22, through which electric current output from the current sensors 10 is input to the load 2, may also be defined as "input bus bars of the load 2".

In some forms of the present disclosure, as illustrated in FIG. 1, the load 2 may be a three-phase alternating current motor, and the power source 1 may be a high-voltage direct current (DC) battery. Accordingly, the inverter 3 may be configured to convert high-voltage DC supplied from the power source 1 to alternating current (AC).

In the case where the load 2 is a three-phase alternating current motor as described above, three first bus bars 21 may be provided to output three-phase direct current, and three second bus bars 22 and three current sensors 10 may be provided to correspond to the three first bus bars 21.

Figure 2:
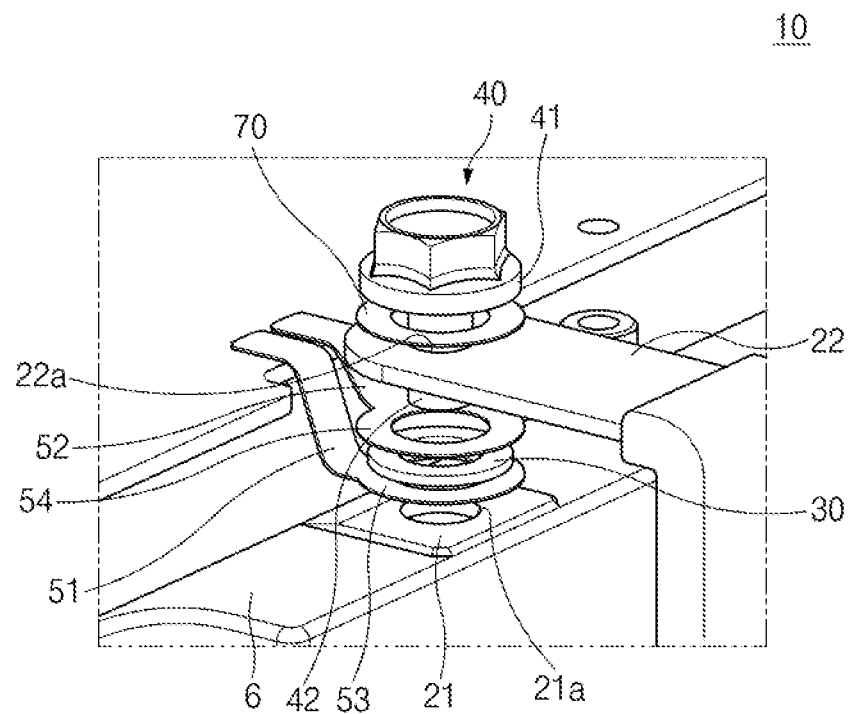
FIG. 2 is an exploded perspective view of the current sensor.
Figure 3:
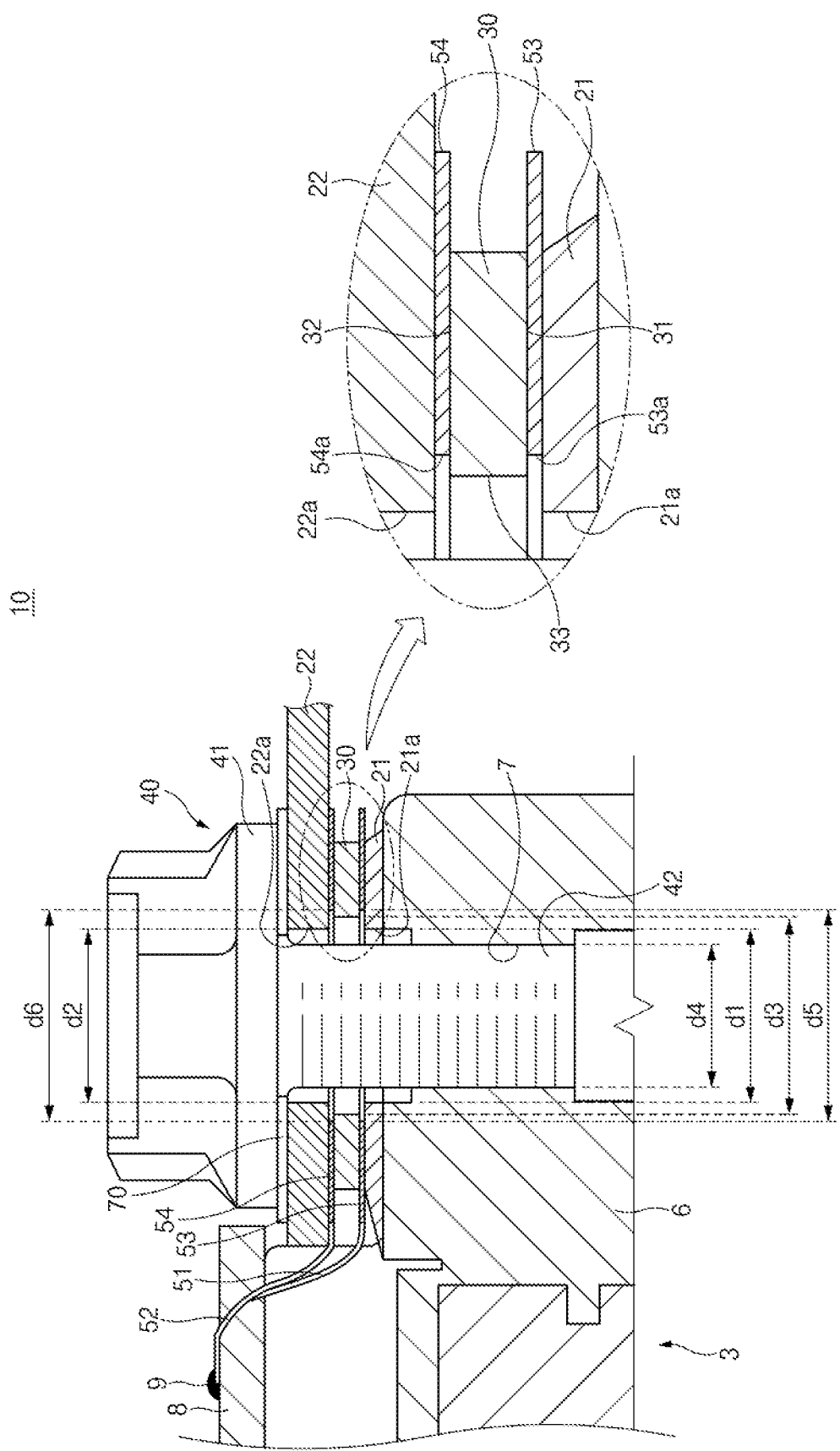
FIG. 3 is a side sectional view of the current sensor.

Referring to FIGS. 2 and 3, the current sensor 10 according to the present disclosure 10 may include a shunt resistor 30 interposed between the first bus bar 21 and the second bus bar 22 and a fastener 40 coupled through the first and second bus bars 21 and 22 and the shunt resistor 30.

The first bus bar 21 may be configured to receive electric current supplied from the power source 1. The first bus bar 21 may have a first through-hole 21a through which the fastener 40 passes.

In some forms of the present disclosure, the first bus bar 21 may be attached to an insulating substrate 6 of the power module 5 of the inverter 3. The insulating substrate 6 of the power module 5 may have a fastening hole 7 aligned with the first through-hole 21a, and an internal female thread to which the fastener 40 is screw-coupled may be formed on the inner surface of the fastening hole 7.

The second bus bar 22 may have a second through-hole 22a through which the fastener 40 passes, and electric current output through the second bus bar 22 may be input to the load 2.

The shunt resistor 30 may have a ring shape having a third through-hole 33 through which the fastener 40 passes. The first through-hole 21a of the first bus bar 21, the second through-hole 22a of the second bus bar 22, and the third through-hole 33 of the shunt resistor 30 may be aligned with the fastening hole 7 in the direction in which the fastener 40 is fastened.

The shunt resistor 30 may have a first connection surface 31 configured to electrically connected with the first bus bar 21 and a second connection surface 32 configured to electrically connected with the second bus bar 22.

In some forms of the present disclosure, the fastener 40 may be a bolt having a head 41 and a threaded part 42. The threaded part 42 of the fastener 40 may pass through the first through-hole 21a of the first bus bar 21, the third through-hole 33 of the shunt resistor 30, and the second through-hole 22a of the second bus bar 22. The first bus bar 21, the shunt resistor 30, and the second bus bar 22 may be pressed in the direction in which the fastener 40 is fastened, by fastening the threaded part 42 of the fastener 40 to the fastening hole 7 of the insulating substrate 6 of the power module 5.

As described above, by fastening the fastener 40, the first bus bar 21, the shunt resistor 30, and the second bus bar 22 may be fixed together while being pressed. Accordingly, it is possible to stably ensure electrical connection between the first bus bar 21 and the shunt resistor 30 and electrical connection between the second bus bar 22 and the shunt resistor 30, and it is very easy to assemble the shunt resistor 30. In addition, it is possible to make the layout and size of the current sensor 10 compact, thereby reducing manufacturing cost.

Especially, since the shunt resistor 30 is fixed between the first bus bar 21 and the second bus bar 22 by fastening the fastener 40, even if the shunt resistor 30 is incorrectly assembled, it is easy to rework the assembly.

Figure 4:
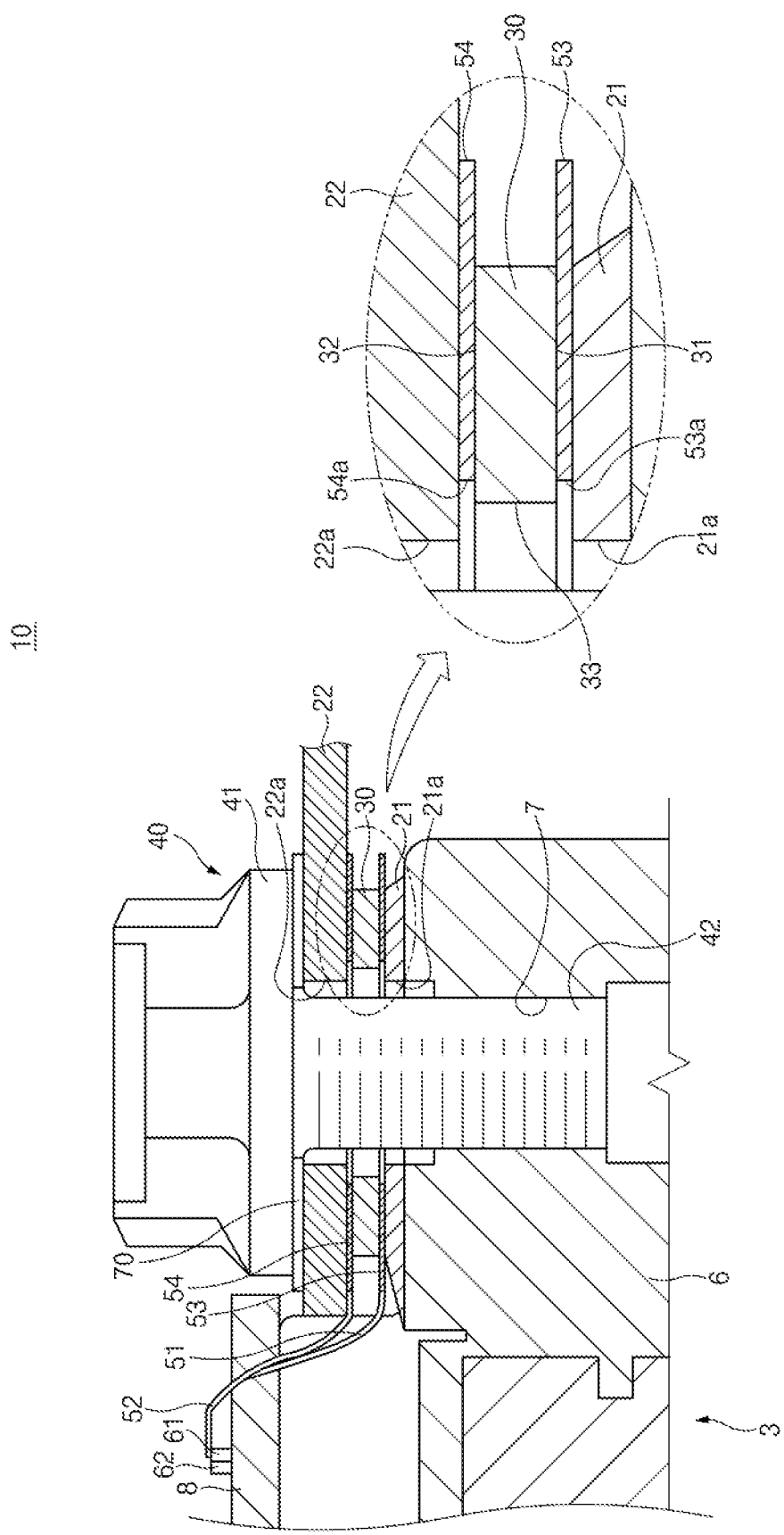
FIG. 4 is a side sectional view of a current sensor.

An insulating washer 70, which is formed of an insulating material, may be interposed between the fastener 40 and any one bus bar 21 or 22 adjacent thereto to insulate the fastener 40 from the adjacent bus bar. For example, as illustrated in FIGS. 3 and 4, the insulating washer 70, which is formed of an insulating material, may be interposed between the bottom surface of the head 41 of the fastener 40 and the top surface of the second bus bar 22. The insulating washer 70 may interrupt an electric current flow from the first bus bar 21, the second bus bar 22, and the shunt resistor 30 to the fastener 40, thereby enhancing the accuracy of current sensing.

The outer diameter d4 of the threaded part 42 of the fastener 40 may be smaller than the inner diameter d1 of the first through-hole 21a, the inner diameter d2 of the second through-hole 22a, and the inner diameter d3 of the third through-hole 33. Accordingly, the threaded part 42 of the fastener 40 may not make direct contact with the first and second bus bars 21 and 22 and the shunt resistor 30 so that electric current may be prevented from flowing from the first bus bar 21, the second bus bar 22, and the shunt resistor 30 to the fastener 40, and thus the accuracy of current sensing may be enhanced.

The inner diameter d1 of the first through-hole 21a may be the same as the inner diameter d2 of the second through-hole 22a, and the inner diameter d3 of the third through-hole 33 of the shunt resistor 30 may be the same as, or different from, the inner diameter d1 of the first through-hole 21a and the inner diameter d2 of the second through-hole 22a.

The opposite surfaces of the shunt resistor 30 may be electrically connected to a current sensing circuit of a gate board 8 of the inverter 3 through first and second sensing wires 51 and 52.

The first sensing wire 51 may be connected to the first connection surface 31 of the shunt resistor 30, and the second sensing wire 52 may be connected to the second connection surface 32 of the shunt resistor 30.

A first shunt resistance washer 53 may be integrally connected to one end of the first sensing wire 51. The first shunt resistance washer 53 may have a ring shape having a through-hole 53a through which the threaded part 42 of the fastener 40 passes. The first shunt resistance washer 53 may be interposed between the first bus bar 21 and the first connection surface 31 of the shunt resistor 30. The first shunt resistance washer 53 may be tightly brought into close contact with the first bus bar 21 and the first connection surface 31 of the shunt resistor 30 by fastening the threaded part 42 of the fastener 40 to the fastening hole 7 of the insulating substrate 6. Electrical connection between the first bus bar 21 and the first connection surface 31 of the shunt resistor 30 may be stably ensured by the first shunt resistance washer 53.

A second shunt resistance washer 54 may be integrally connected to one end of the second sensing wire 52. The second shunt resistance washer 54 may have a ring shape having a through-hole 54a through which the threaded part 42 of the fastener 40 passes. The second shunt resistance washer 54 may be interposed between the second bus bar 22 and the second connection surface 32 of the shunt resistor 30. The second shunt resistance washer 54 may be tightly brought into close contact with the second bus bar 22 and the second connection surface 32 of the shunt resistor 30 by fastening the threaded part 42 of the fastener 40 to the fastening hole 7 of the insulating substrate 6. Electrical connection between the second bus bar 22 and the second connection surface 32 of the shunt resistor 30 may be stably ensured by the second shunt resistance washer 54.

The outer diameter d4 of the threaded part 42 of the fastener 40 may be smaller than the inner diameter d5 of the through-hole 53a of the first shunt resistance washer 53 and the inner diameter d6 of the through-hole 54a of the second shunt resistance washer 54. Accordingly, the threaded part 42 of the fastener 40 may not make direct contact with the first and second shunt resistance washers 53 and 54 so that electric current may be prevented from flowing from the first and second shunt resistance washers 53 and 54 to the fastener 40, and thus the accuracy of current sensing may be enhanced.

In some forms of the present disclosure, an opposite end of the first sensing wire 51 may be connected to the current sensing circuit of the gate board 8 of the inverter 3 through solder 9, and an opposite end of the second sensing wire 52 may be connected to the current sensing circuit of the gate board 8 of the inverter 3 through the solder 9. Accordingly, the current sensing circuit of the gate board 8 may accurately sense electric current flowing through the shunt resistor 30. Since the opposite end of the first sensing wire 51 and the opposite end of the second sensing wire 52 are soldered to the current sensing circuit of the gate board 8 as described above, it is possible to improve the quality of electrical contact of the first and second sensing wires 51 and 52 and to shorten the first and second sensing wires 51 and 52. Furthermore, since the opposite end of the first sensing wire 51 and the opposite end of the second sensing wire 52 are soldered to the current sensing circuit of the gate board 8, the gate board 8 may be easily and simply mounted in the power module 5 of the inverter 3, and the shunt resistor 30 may be easily and simply mounted between the first bus bar 21 and the second bus bar 22.

In some forms of the present disclosure, a first connector 61 may be mounted on the opposite end of the first sensing wire 51 and the opposite end of the second sensing wire 52, and a second connector 62 may be mounted on the current sensing circuit of the gate board 8 of the inverter 3. The first connector 61 of the first and second sensing wires 51 and 52 may be removably coupled to the second connector 62 of the gate board 8 by a snap-fit connection. Accordingly, the current sensing circuit of the gate board 8 may accurately sense electric current flowing through the shunt resistor 30.

As described above, the first sensing wire 51 and the second sensing wire 52 may be integrally connected to the first shunt resistance washer 53 and the second shunt resistance washer 54, respectively, and the first shunt resistance washer 53 and the second shunt resistance washer 54 may be tightly brought into close contact with the opposite surfaces of the shunt resistor 30 by fastening the fastener 40. Accordingly, it is possible to stably ensure electrical connection between the shunt resistor 30 and the current sensing circuit of the gate board 8.

The current sensor 10 in some forms of the present disclosure may be mounted in an inverter-motor system of an electric vehicle, a hybrid electric vehicle, or the like to sense electric current supplied to a motor, thereby appropriately controlling the electric current of the motor.

The description of the disclosure is merely exemplary in nature and, thus, variations that do not depart from the substance of the disclosure are intended to be within the scope of the disclosure. Such variations are not to be regarded as a departure from the spirit and scope of the disclosure.

What is claimed is:

1. A current sensor comprising:
    a shunt resistor provided between a first bus bar and a second bus bar; and
    a fastener coupled through the first bus bar, the second bus bar, and the shunt resistor, wherein the fastener is not in direct contact with the first bus bar, the second bus bar, and the shunt resistor,
    wherein the first bus bar has a first through-hole, the second bus bar has a second through-hole, and the shunt resistor has a third through-hole,
    wherein the first through-hole, the second through-hole, and the third through-hole are aligned with one another to allow the fastener to pass through the first to third through-holes,
    wherein the fastener comprises:
        a head; and
        a threaded part of the fastener configured to extend from the head, and
    wherein the threaded part of the fastener has an outer diameter that is smaller than an inner diameter of the first through-hole, an inner diameter of the second through-hole, and an inner diameter of the third through-hole.

2. The current sensor of claim 1, wherein the shunt resistor comprises:
    a first connection surface configured to electrically connect with the first bus bar; and
    a second connection surface configured to electrically connect with the second bus bar.

3. The current sensor of claim 2, wherein an insulating washer is formed of an insulating material and is provided between the fastener and the bus bar adjacent to the fastener.

4. The current sensor of claim 1, wherein the shunt resistor is electrically connected to a gate board of an inverter through a first sensing wire and a second sensing wire.

5. The current sensor of claim 4, wherein the first sensing wire is connected to a first connection surface of the shunt resistor, and
    wherein the second sensing wire is connected to a second connection surface of the shunt resistor.

6. The current sensor of claim 5, wherein a first shunt resistance washer is integrally connected to one end of the first sensing wire,
    wherein the first shunt resistance washer has a through-hole through which the fastener passes, and
    wherein the first shunt resistance washer is provided between the first bus bar and the first connection surface of the shunt resistor.

7. The current sensor of claim 6, wherein an opposite end of the first sensing wire is connected to the gate board of the inverter through soldering.

8. The current sensor of claim 5, wherein a second shunt resistance washer is integrally connected to one end of the second sensing wire,
    wherein the second shunt resistance washer has a through-hole through which the fastener passes, and
    wherein the second shunt resistance washer is provided between the second bus bar and the second connection surface of the shunt resistor.

9. The current sensor of claim 8, wherein an opposite end of the second sensing wire is connected to the gate board of the inverter through soldering.

10. The current sensor of claim 1, wherein the first bus bar is connected to a power source through an inverter, and
    wherein the second bus bar is connected to a load.

11. The current sensor of claim 10, wherein the first bus bar is attached to an insulating substrate of a power module of the inverter, and
    wherein the insulating substrate of the power module of the inverter has a fastening hole to which the fastener is fastened.

\* \* \* \* \*